United States Patent
Pallerla et al.

(10) Patent No.: US 11,170,845 B1
(45) Date of Patent: Nov. 9, 2021

(54) TECHNIQUES FOR REDUCING ROCK BOTTOM LEAKAGE IN MEMORY

(71) Applicant: QUALCOMM Incorporated, San Diego, CA (US)

(72) Inventors: Arun Babu Pallerla, San Diego, CA (US); Derek Yang, San Diego, CA (US); Chulmin Jung, San Diego, CA (US); Changho Jung, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/928,658

(22) Filed: Jul. 14, 2020

(51) Int. Cl.
*G11C 8/08* (2006.01)
*G11C 11/418* (2006.01)

(52) U.S. Cl.
CPC .............. *G11C 11/418* (2013.01); *G11C 8/08* (2013.01)

(58) Field of Classification Search
CPC ................................ G11C 8/08; G11C 11/418
See application file for complete search history.

(56) References Cited

U.S. PATENT DOCUMENTS

| | | | | |
|---|---|---|---|---|
| 2004/0196724 A1* | 10/2004 | Chen | ................... | G11C 11/4074 365/230.05 |
| 2005/0254299 A1* | 11/2005 | Tanuma | ................. | G11C 16/08 365/185.11 |
| 2005/0281071 A1* | 12/2005 | Jeon | ....................... | G11C 11/22 365/145 |
| 2006/0119991 A1* | 6/2006 | Garg | ....................... | G11C 5/14 361/18 |
| 2010/0226191 A1* | 9/2010 | Jung | ....................... | G11C 8/08 365/203 |

* cited by examiner

*Primary Examiner* — Jay W. Radke
(74) *Attorney, Agent, or Firm* — Patterson & Sheridan, L.L.P.

(57) ABSTRACT

Certain aspects of the present disclosure are directed to a memory system. The memory system generally includes a word line (WL) driver circuit comprising a transistor coupled between a WL of a memory and a reference potential node. The memory system also includes a clamping circuit having logic configured to generate a control signal to drive a gate of the transistor such that the control signal is floating when the first head switch is open, and a first head switch coupled between a voltage rail and a supply input of the logic.

20 Claims, 4 Drawing Sheets

TECHNIQUES FOR REDUCING ROCK BOTTOM LEAKAGE IN MEMORY

FIELD OF THE DISCLOSURE

The teachings of the present disclosure relate generally to electronic systems, and more particularly, to a memory device.

BACKGROUND

Electronic devices including processors and memory are used extensively today in almost every electronic application. The processor controls the execution of program instructions, arithmetic functions, and access to memory and peripherals. In the simplest form, the processor executes program instructions by performing one or more arithmetic functions on data stored in memory. There are many different types of memory, which may be implemented using any of various suitable technologies.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to a memory system. The memory system generally includes a word line (WL) driver circuit comprising a transistor coupled between a WL of a memory and a reference potential node. The memory system also includes a clamping circuit having logic configured to generate a control signal to drive a gate of the transistor, and a first head switch coupled between a voltage rail and a supply input of the logic, wherein the logic is configured to generate the control signal to drive the gate of the transistor such that the control signal is floating when the first head switch is open.

Certain aspects of the present disclosure are directed to a method for memory control. The method generally includes generating, via logic of a clamping circuit, a control signal to drive a gate of a transistor of a WL driver circuit; selectively coupling, via the transistor, a WL of a memory to a reference potential node based on the control signal; and selectively coupling, via a first head switch of the clamping circuit, a voltage rail to a supply input of the logic such that the control signal is floating when the first head switch is open.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
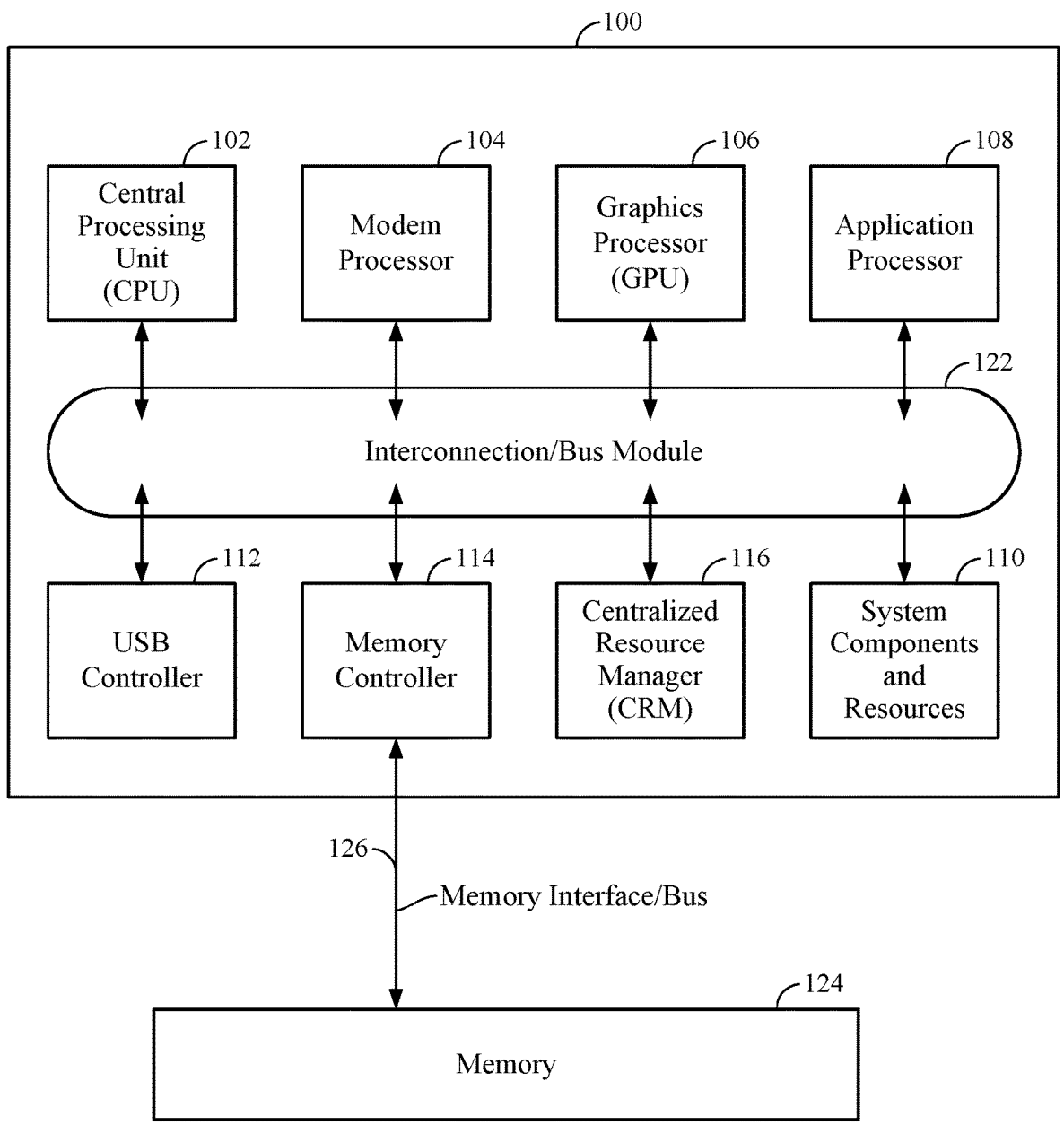
FIG. 1 is an illustration of an exemplary system-on-chip (SoC) integrated circuit design, in accordance with certain aspects of the present disclosure.

Certain aspects of the present disclosure are generally directed to a memory system implemented to reduce rock bottom sleep current (RBSC). For example, certain aspects provide circuitry for controlling a sleep mode of operation associated with memory. The circuitry may be implemented using head switches in a manner to reduce gate leakage current and subthreshold leakage current associated with transistors of the memory system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate.

A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Example SoC

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects, the memory 124 may be a static random access memory (SRAM). In some aspects, the memory controller 114 may include sleep mode control circuitry implemented in a manner to reduce RBSC, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Techniques for Reducing Rock Bottom Leakage in Memory

Certain aspects of the present disclosure are directed to a circuit for reducing rock bottom sleep current (RBSC) associated with a memory system, such as the memory controller 114 configured to control the memory 124. RBSC generally refers to the current consumption of the memory system when the memory is in a sleep mode of operation. The sleep mode of operation may include a sleep retention mode of operation, or a sleep non-retention mode of operation. As used herein, a retention mode generally refers to a mode of operation in which data stored in memory is retained, and a non-retention mode generally refers to a mode of operation where data stored in memory is not retained.

Memory rock bottom sleep current is a major contributor to the idle power consumption of a mobile phone. Certain aspects of the present disclosure are directed to techniques for reducing the rock bottom leakage current by reducing gate leakage and subthreshold leakage in word-line (WL) decoders.

Figure 2:
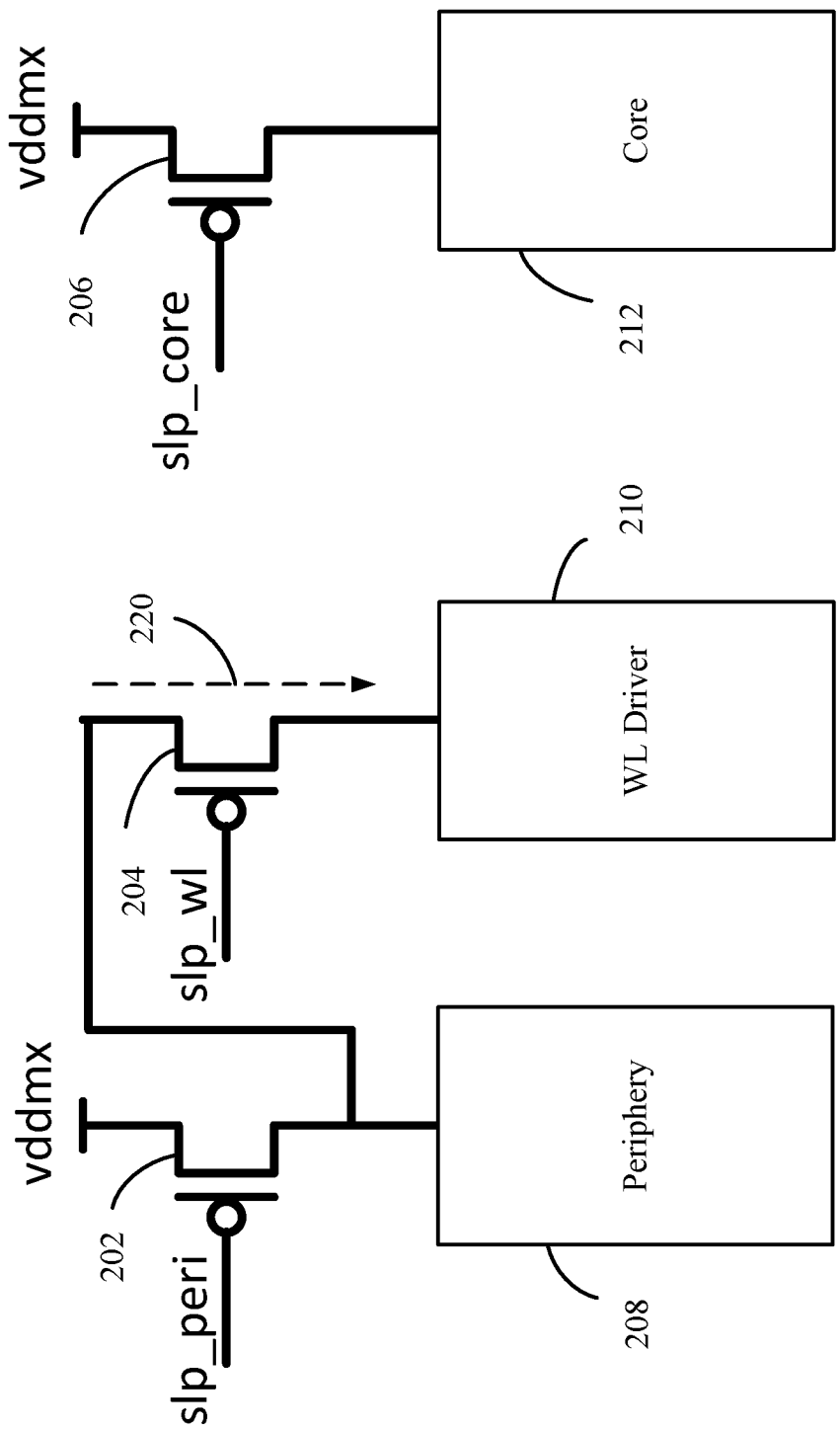
FIG. 2 illustrates head switches for a peripheral circuit, a word line (WL) driver circuit, and a core circuit, in accordance with certain aspects of the present disclosure.

FIG. 2 illustrates head switches 202, 204, 206 for a peripheral circuit 208, a WL driver circuit 210, and a core circuit 212, respectively, in accordance with certain aspects of the present disclosure. As used herein, a head switch generally refers to a switch for selectively coupling a voltage rail to a circuit. The head switches 202, 204, 206 may be implemented using p-type metal-oxide-semiconductor (PMOS) transistors.

The core circuit 212 may include memory cells, each having a WL. The WL driver circuit 210 generates signals for driving the WLs of the memory cells. The peripheral circuit 208 may include logic for controlling the WL driver circuit 210. The head switch 202 may receive a sleep peripheral (slp_peri) signal that is logic high during a sleep retention mode of operation and sleep non-retention mode of operation. In other words, during sleep retention mode of operation and sleep non-retention mode of operation, the slp_peri signal controlling the head switch 202 may be logic high to open head switch 202, decoupling the supply input of the peripheral circuit 208 from the voltage rail (vddmx). The sleep core (slp_core) signal controlling head switch 206 may be logic low during a sleep retention mode of operation, and logic high during a sleep non-retention mode of operation. In other words, during sleep retention mode of operation, supply voltage may be applied to the core circuit 212 such that the data stored in the memory cells are maintained, but not for sleep non-retention mode.

In certain aspects of the present disclosure, the coupling between vddmx and the source of the head switch 204 may be gated by the head switch 202 to reduce any subthreshold leakage current 220 associated with the head switch 204. For example, even when the sleep WL (slp_wl) signal at the gate of head switch 204 is logic high to open the head switch 204, subthreshold leakage current 220 may still flow from the source to the drain of the head switch 204, if the source of the head switch 204 is directly coupled to a voltage rail. In certain aspects, the source of the head switch 204 may be coupled to the drain of the head switch 202 such that the source of the head switch 204 is selectively coupled to vddmx via the head switch 202, reducing the subthreshold leakage associated with the head switch 204 when operating in a sleep mode of operation. In other words, during the sleep mode of operation, the head switch 202 is open, breaking the current flow path from vddmx to the head switch 204 and reducing the subthreshold leakage current 220.

Figure 3:
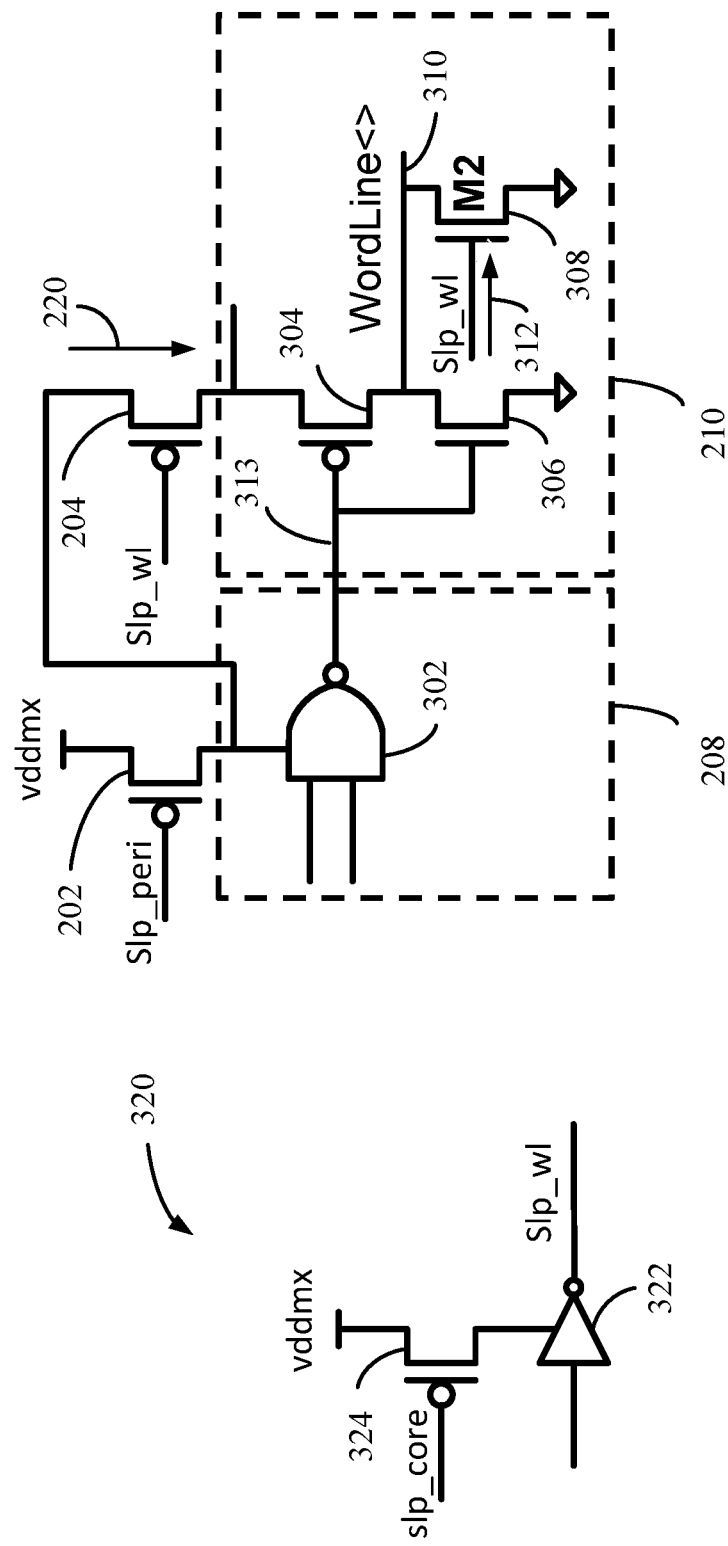
FIG. 3 illustrates a peripheral circuit and a WL driver circuit, in accordance with certain aspects of the present disclosure.

FIG. 3 illustrates the peripheral circuit 208 and the WL driver circuit 210, in accordance with certain aspects of the present disclosure. As illustrated, the peripheral circuit 208 includes a NAND gate 302. The head switch 202 may selectively couple vddmx to the supply input of the NAND gate 302. The WL driver circuit 210 may include a NOR gate implemented using transistors 304, 306, 308. For example, the PMOS transistor 304 and the n-type metal-oxide-semiconductor (NMOS) transistor 306 form a complementary metal-oxide-semiconductor (CMOS) inverter. Moreover, the NMOS transistor 308 couples the WL 310 to electric ground (e.g., a reference potential node) when the sleep WL (slp_wl) signal is logic high. Therefore, the signal at the WL 310 is only logic high when the control signal at node 313 (e.g., at output of NAND gate 302) and the slp_wl signal are both logic low, in effect implementing a NOR gate.

Certain aspects of the present disclosure provide a clamping circuit 320 for reducing gate leakage current 312 associated with the transistor 308 during a sleep non-retention mode of operation. The clamping circuit 320 may include an inverter 322 for generating the slp_wl signal, the output of the inverter 322 being coupled to the gate of the transistor 308. As illustrated, a head switch 324 may be coupled between a supply input of the inverter 322 and vddmx. The head switch 324 is controlled via the slp_core signal which is logic high during the sleep non-retention mode of operation, opening the head switch 324. Therefore, during sleep non-retention mode of operation, the slp_wl signal may be floating (e.g., decoupled from vddmx), reducing the gate leakage current 312. In sleep retention mode, the slp_core signal is logic low, and the head switch 324 is closed such that functionality during the retention mode is not impacted.

Figure 4:
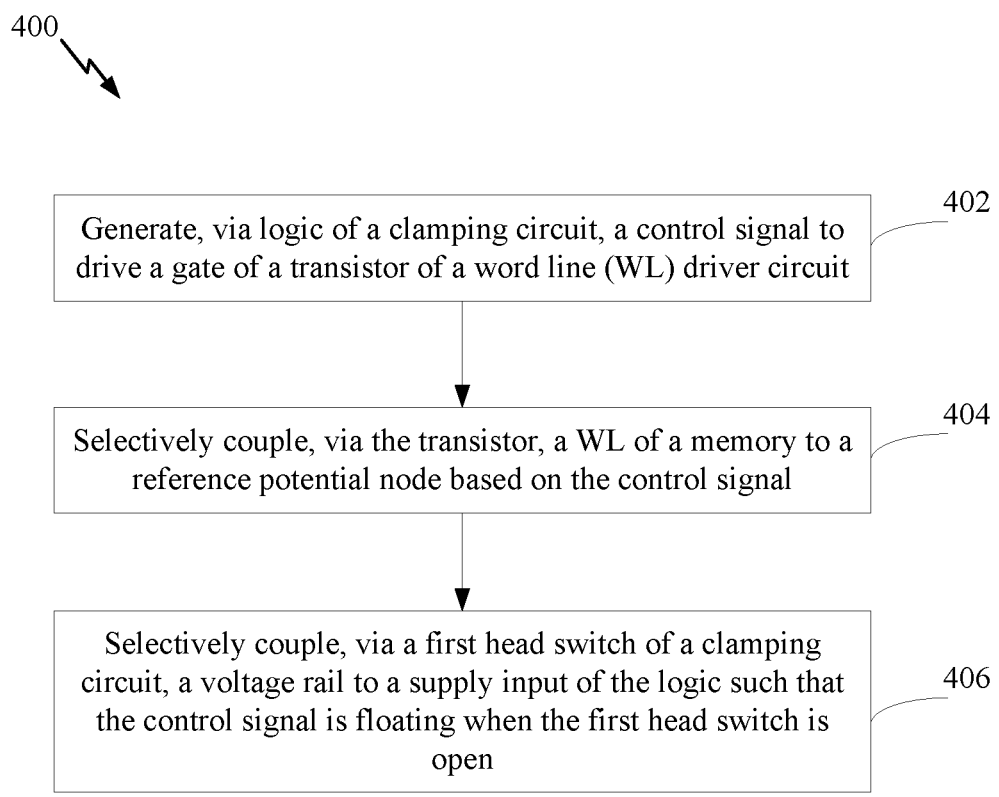
FIG. 4 is a flow diagram illustrating example operations for memory control, in accordance with certain aspects of the present disclosure.

FIG. 4 is a flow diagram illustrating example operations 400 for memory control, in accordance with certain aspects of the present disclosure. The operations 400 may be performed via a memory system.

The operations 400 begin, at block 402, with the memory system generating, via logic (e.g., inverter 322) of a clamping circuit, a control signal (e.g., slp_wl signal) to drive a gate of a transistor (e.g., transistor 308) of a word line (WL) driver circuit (e.g., WL driver circuit 210). For example, generating the control signal may include setting the control signal to logic high during a sleep retention mode. In some aspects, the WL driver circuit may include an inverter (e.g., CMOS inverter implemented by transistors 304, 306) having an output coupled to a drain of the transistor.

At block 404, the memory system selectively couples, via the transistor, a WL (e.g., WL 310) of a memory (e.g., memory in core circuit 212) to a reference potential node (e.g., electric ground) based on the control signal. At block 406, the memory system selectively couples, via a first head switch (e.g., head switch 324) of the clamping circuit (e.g., clamping circuit 320), a voltage rail (e.g., vddmx) to a supply input of the logic such that the control signal is floating when the first head switch is open. For example, selectively coupling the voltage rail to the supply input may include opening the first head switch during a sleep non-retention mode of operation.

In certain aspects, the operations 400 may also include selectively coupling, via a second head switch (e.g., head switch 202), the voltage rail to a supply input of a peripheral circuit (e.g., peripheral circuit 208), and selectively coupling, via a third head switch (e.g., head switch 204), the second head switch to a supply input of the WL driver circuit. In certain aspects, selectively coupling the voltage rail to the supply input of the peripheral circuit may include opening the second head switch during a sleep mode of operation. In some aspects, the control signal is further generated to drive the third head switch. In certain aspects, the operations 400 may also include controlling, via logic (e.g., NAND gate 203) of the peripheral circuit, the WL driver circuit.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory system comprising:
   a word line (WL) driver circuit comprising a transistor coupled between a WL of a memory and a reference potential node; and
   a clamping circuit comprising:
      logic configured to generate a control signal to drive a gate of the transistor; and
      a first head switch coupled between a voltage rail and a supply input of the logic, wherein the logic is configured to generate the control signal to drive the gate of the transistor such that the control signal is floating when the first head switch is open.

2. The memory system of claim 1, wherein the first head switch is configured to be open during a sleep non-retention mode of operation of the memory system.

3. The memory system of claim 1, wherein the logic comprises an inverter.

4. The memory system of claim 1, wherein the control signal is configured to be logic high during a sleep retention mode of the memory system.

5. The memory system of claim 1, wherein the WL driver circuit further comprises an inverter having an output coupled to a drain of the transistor.

6. The memory system of claim 1, further comprising:
   a second head switch coupled between a voltage rail and a supply input of a peripheral circuit; and
   a third head switch coupled between the second head switch and a supply input of the WL driver circuit.

7. The memory system of claim 6, wherein the second head switch is configured to be open during a sleep mode of operation of the memory system.

8. The memory system of claim 6, wherein the logic is further configured to generate the control signal to drive the third head switch.

9. The memory system of claim 6, wherein the peripheral circuit comprises logic configured to control the WL driver circuit.

10. The memory system of claim 1, wherein the transistor comprises an n-type metal-oxide-semiconductor (NMOS) transistor.

11. A method for memory control, comprising:
    generating, via logic of a clamping circuit, a control signal to drive a gate of a transistor of a word line (WL) driver circuit;
    selectively coupling, via the transistor, a WL of a memory to a reference potential node based on the control signal; and
    selectively coupling, via a first head switch of the clamping circuit, a voltage rail to a supply input of the logic such that the control signal is floating when the first head switch is open.

12. The method of claim 11, wherein the selectively coupling the voltage rail to the supply input comprises opening the first head switch during a sleep non-retention mode of operation.

13. The method of claim 11, wherein the logic comprises an inverter.

14. The method of claim 11, wherein generating the control signal comprises setting the control signal to logic high during a sleep retention mode.

15. The method of claim 11, wherein the WL driver circuit further comprises an inverter having an output coupled to a drain of the transistor.

16. The method of claim 11, further comprising:
    selectively coupling, via a second head switch, the voltage rail to a supply input of a peripheral circuit; and
    selectively coupling, via a third head switch, the second head switch to a supply input of the WL driver circuit.

17. The method of claim 16, wherein selectively coupling the voltage rail to the supply input of the peripheral circuit comprises opening the second head switch during a sleep mode of operation.

18. The method of claim 16, wherein the control signal is further generated to drive the third head switch.

19. The method of claim 16, further comprising controlling, via logic of the peripheral circuit, the WL driver circuit.

20. The method of claim 11, wherein the transistor comprises an n-type metal-oxide semiconductor (NMOS) transistor.

\* \* \* \* \*